United States Patent [19]

Tseng et al.

[11] Patent Number: 5,631,480
[45] Date of Patent: May 20, 1997

[54] DRAM STACK CAPACITOR WITH LADDER STORAGE NODE

[75] Inventors: Horng-Huei Tseng; Chih-Yuan Lu, both of Hsin-Chu, Taiwan

[73] Assignee: Industrial Technology Research Institute, Hsinchu, Taiwan

[21] Appl. No.: 494,637

[22] Filed: Jun. 23, 1995

Related U.S. Application Data

[62] Division of Ser. No. 289,633, Aug. 12, 1994, Pat. No. 5,451,537.

[51] Int. Cl.$^6$ .................................................. H01L 27/108
[52] U.S. Cl. .................................... 257/309; 257/534
[58] Field of Search ................................ 257/309, 534

[56] References Cited

U.S. PATENT DOCUMENTS

| | | | |
|---|---|---|---|
| 5,110,752 | 5/1992 | Lu | 257/309 |
| 5,162,881 | 11/1992 | Ohya | 257/309 |
| 5,183,772 | 2/1993 | Jin et al. | 437/52 |
| 5,245,206 | 9/1993 | Chu et al. | 257/309 |
| 5,326,998 | 7/1994 | Jun | 257/309 |

FOREIGN PATENT DOCUMENTS

| | | | |
|---|---|---|---|
| 61-174663 | 8/1986 | Japan | 257/534 |
| 4216666 | 8/1992 | Japan | 257/309 |

*Primary Examiner*—Mark V. Prenty
*Attorney, Agent, or Firm*—George O. Saile; Stephen B. Ackerman

[57] ABSTRACT

A method, and resultant structure, is described for fabricating a DRAM (Dynamic Random Access Memory) cell having a stack capacitor with a ladder storage node, connected to a MOS (Metal Oxide Semiconductor) transistor with source and drain regions, to form a DRAM cell. A bottom electrode is connected to and extends up from the source region of the transistor, and has a top surface with a central cavity, and side surfaces extending down from the top surface in a step-like manner. These step-like sides are formed by a repeated two-step process of removing a portion of the vertical walls of a photoresist mask and removing a portion of the top surface of a layer of polysilicon from which the bottom electrode is formed. There is a capacitor dielectric over the bottom electrode. A top electrode is formed over the capacitor dielectric.

2 Claims, 7 Drawing Sheets

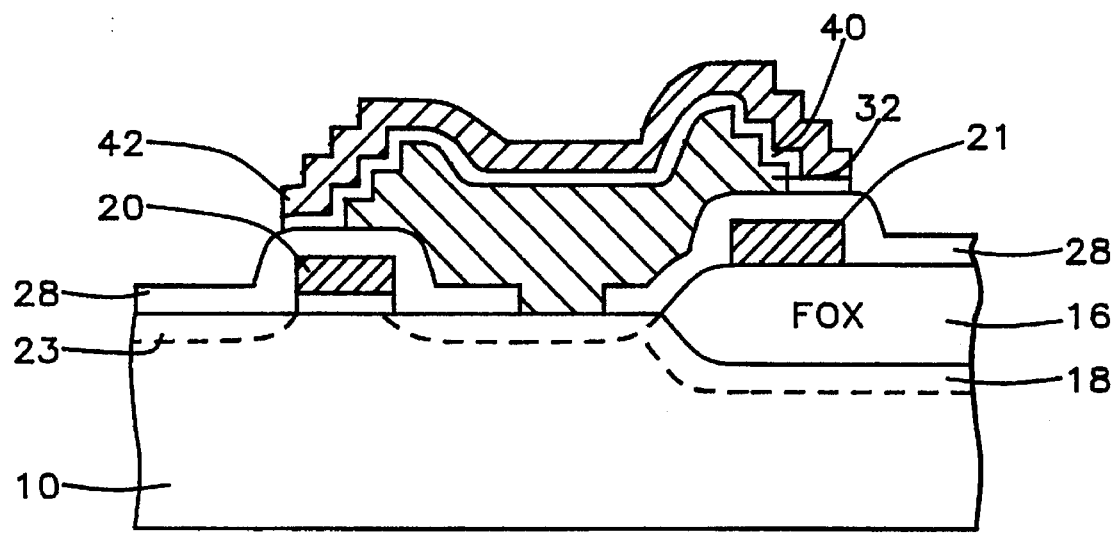
FIG. 12
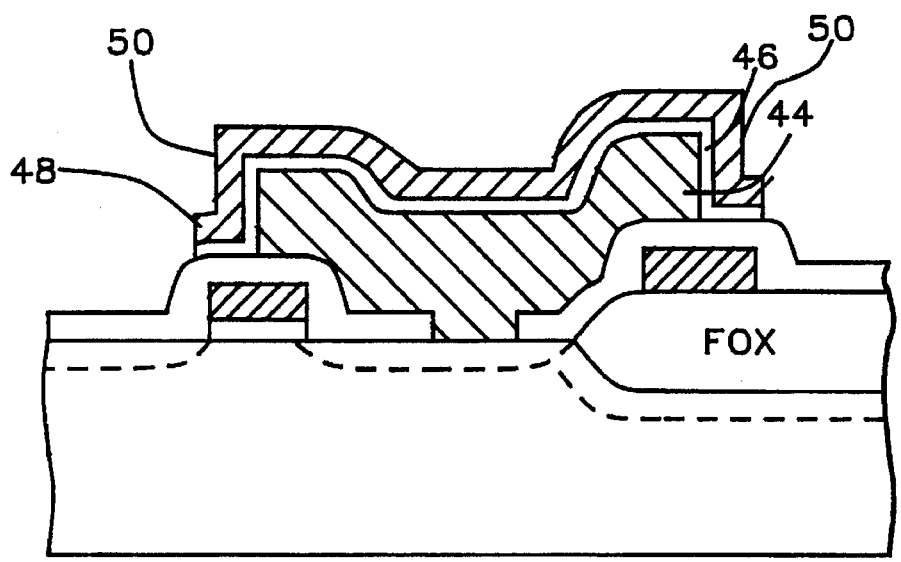
FIG. 13 - Prior Art

DRAM STACK CAPACITOR WITH LADDER STORAGE NODE

This application is a divisional of application Ser. No. 08/289,633, filed Aug. 12, 1994 and now U.S. Pat. No. 5,451,537.

BACKGROUND OF THE INVENTION

(1) Field of the Invention

This invention relates to a method of making and the resultant structure for a DRAM (Dynamic Random Access Memory) cell, and more particularly to a method of making, and the resultant structure of, a DRAM stack capacitor with a adder storage node.

(2) Description of the Related Art

A typical DRAM cell consists of a single transistor and a storage capacitor. Digital information is stored in the capacitor and accessed through the transistor, by way of addressing the desired memory cell, which is connected with other such cells through an array of bit lines and word lines. In order to construct high density DRAMs in a reasonably sized chip area, both the transistor and capacitor elements must occupy less lateral space in each memory cell. As DRAMs are scaled down in dimensions, there is a continuous challenge to maintain a sufficiently high stored charge per capacitor unit area. Efforts to increase capacitance without increasing the planar area of the capacitor have been concentrated on building three dimensional capacitor structures, which increase the capacitor surface area. Thus cell structures have to change from the conventional planar-type capacitors to either trench capacitors or stack capacitors, in particular at densities above 4 Mbit.

When the stacked capacitor approach is used, in order to maintain sufficient capacitance the storage node must have a large surface area, and consequently must be formed significantly above the surface of the substrate in which the DRAM cell is formed, thus leading to topological problems in the formation of subsequent layers.

Workers in the art are aware of these problems, and have attempted to resolve them. For example, in U.S. Pat. No. 5,183,772 (Jin et al) a method is shown for forming a stack capacitor as part of a DRAM cell, in which the capacitor is formed with a saddle shape to reduce later topological problems. However, the saddle shape is an asymmetrical structure with a substantially vertical side slope 50 as can be seen in the cross-sectional view in FIG. 13. The steep slope contributes to continued difficulties with the topology of subsequent layers.

SUMMARY OF THE INVENTION

It is therefore an object of the invention to provide a method for fabricating a DRAM cell with a stack capacitor having a ladder storage node.

It is a further object of the invention to provide a DRAM cell structure with a stack capacitor having a ladder storage node.

These objects are achieved by a method of forming a DRAM stack capacitor with ladder storage node in which a MOS (metal oxide semiconductor) device having source and drain regions, adjacent to a field oxide region on which there is a conductive word line, in a silicon substrate, is provided. A first insulating layer is formed over the MOS device, conductive word line, and field oxide region. The first insulating layer is patterned to form an opening to the source region. A first conductive layer is formed over the first insulating layer and in the opening. A photoresist layer is formed over the first conductive layer. The photoresist layer is patterned to form a first mask that is centered over the opening. A first portion of the top of the first conductive layer is removed, in the regions not covered by the first mask. A portion of the vertical walls of the first mask is removed, to form a second mask. A second portion of the top of the first conductive layer is removed, in the regions not covered by the second mask. A portion of the vertical walls of the second mask is removed, to form a third mask. A third portion of the top of the first conductive layer is removed, in the regions not covered by the third mask, the remainder of the first conductive layer outside of the region previously covered by the first mask is removed, whereby the portion of the first conductive layer that has not been removed forms the ladder storage node. The third mask is removed. A capacitor dielectric layer is formed over the ladder storage node and over exposed portions of the first insulating layer. A second conductive layer is formed over the capacitor dielectric layer. The capacitor dielectric layer and the second conductive layer are patterned to form a capacitor dielectric and top electrode, over and adjacent to the ladder storage node, to complete the stack capacitor.

These objects are further achieved by a DRAM stack capacitor having a ladder storage node, connected to a transistor with source and drain regions. A bottom electrode is connected to and extends up from the source region of the transistor, and has a top surface with a central cavity, and side surfaces extending down from the top surface in a step-like manner. There is a capacitor dielectric over the bottom electrode. A top electrode is formed over the capacitor dielectric.

BRIEF DESCRIPTION OF THE DRAWINGS

FIGS. 1 to 12 are a cross-sectional representation of the invention, and the resultant structure, for a DRAM cell with a stack capacitor having a ladder storage node.

FIG. 13 is a cross-sectional representation of a prior art stack capacitor structure.

DESCRIPTION OF THE PREFERRED EMBODIMENTS

Figure 1:
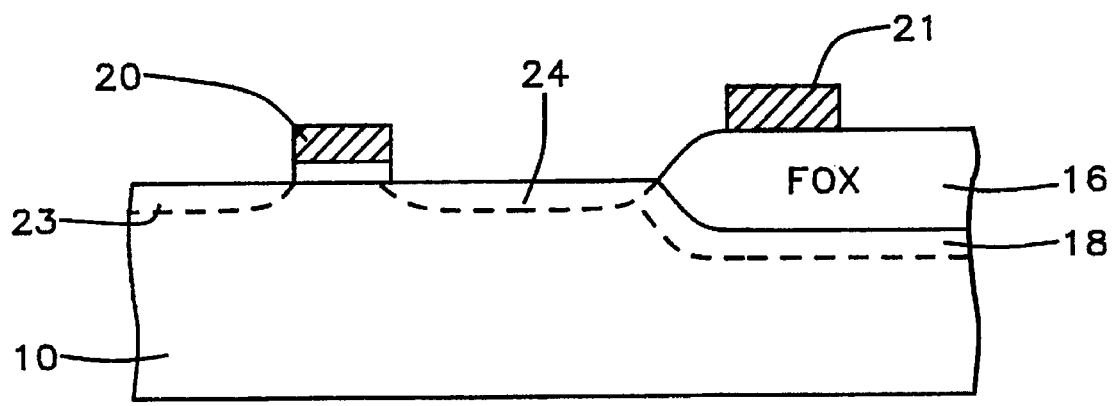

A method for fabricating the DRAM stack capacitor of the invention will now be described with reference to FIGS. 1 to 13. As shown in FIG. 1, a base substrate 10 of, for example, P- monocrystalline silicon, is provided. Field oxide (FOX) isolation regions 16 are formed and serve to isolate semiconductor surface regions from other such regions in the silicon substrate. In an effort to simplify the description and the drawings, the field oxide isolation regions between devices have been only partially shown and will not be described in detail, because they are conventional. One method of forming these regions is described by E. Kooi in U.S. Pat. No. 3,970,486, wherein selected surface portions of a silicon substrate are masked against oxidation, and the exposed unmasked surface is oxidized to grow a thermal oxide which in effect sinks into the silicon surface at the unmasked areas. The mask is removed, and semiconductor devices can then be formed in the openings between the isolation regions. Channel stop implant 18 is formed either before or after FOX 16 formation by ion implanting boron at a concentration of between about 2 E 12 and 5 E 13 atoms/cm$^2$ and at an energy of between about 120 and 180 KeV.

The formation of the field effect transistor, and the word line 21, both shown in FIG. 1, will now be described. A gate oxide layer 11 is formed, typically by thermal oxidation of the silicon substrate to a thickness of between about 80 and 160 Angstroms. A layer of polysilicon is then deposited over the gate oxide and FOX 16, by LPCVD (Low Pressure Chemical Vapor Deposition) to a thickness of between about 1500 and 3000 Angstroms. This layer is doped by ion implanting with phosphorous or arsenic ions at a dosage of between about 5 E 15 and 2 E 16 atoms/cm.$^2$ and an energy of between about 20 and 60 Kev., or is doped with phosphorus oxychloride ($POCl_3$) at a temperature of about between about 875° and 900° C., for between about 30 and 50 minutes. Alternatively, the polysilicon layer may be doped in situ.

The doped polysilicon and oxide are then patterned by conventional lithography and etching to form the gate 20, gate oxide 11 and wordline 21 of FIG. 1. Drain region 23 and source region 24 are then formed by ion implanting an N+ dopant such as phosphorus P31 or arsenic AS75 at a concentration of between about 2 E 15 and 1 E 16 atoms/cm.$^2$ and at an energy of between about 20 and 70 KeV.

Figure 2:
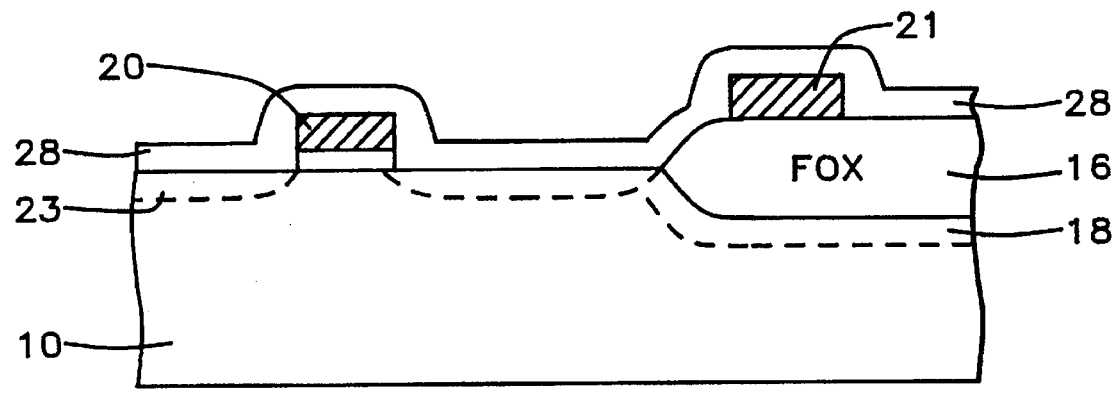
Figure 3:
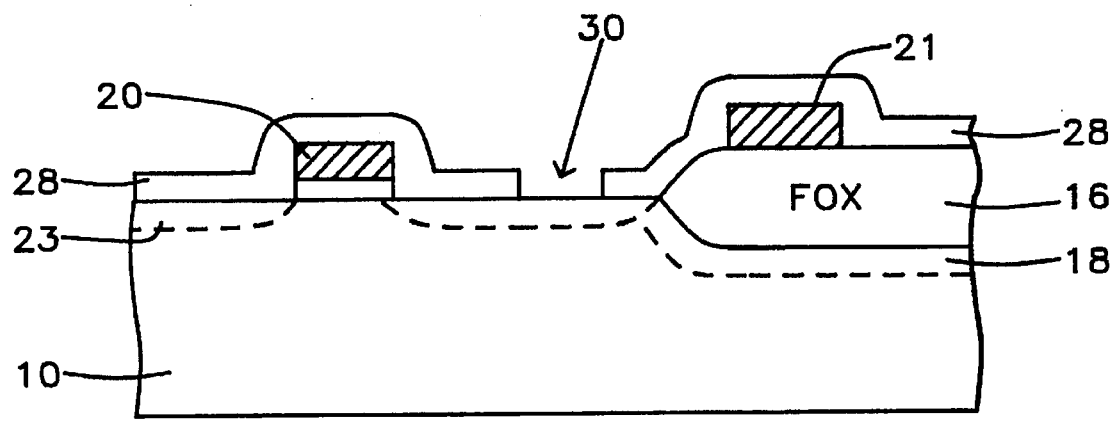

Referring now to FIG. 2, a layer of silicon oxide 28 is formed, by LPCVD, to a thickness of between about 500 and 2000 Angstroms. An opening is then formed in the oxide 28, over the source region 24 between the gate electrode 20 and FOX 16. This will be the location for the formation of the stacked capacitor of the invention, and the opening provides for a contact to the underlying source region 24. As shown in FIG. 3, the contact opening 30 is anisotropically etched by reactive ion etching with a fluorine gas such as $C_2F_6$ (carbon hexafluoride) or $CF_4+H_2$ (carbon tetrafluoride and hydrogen).

Figure 4:
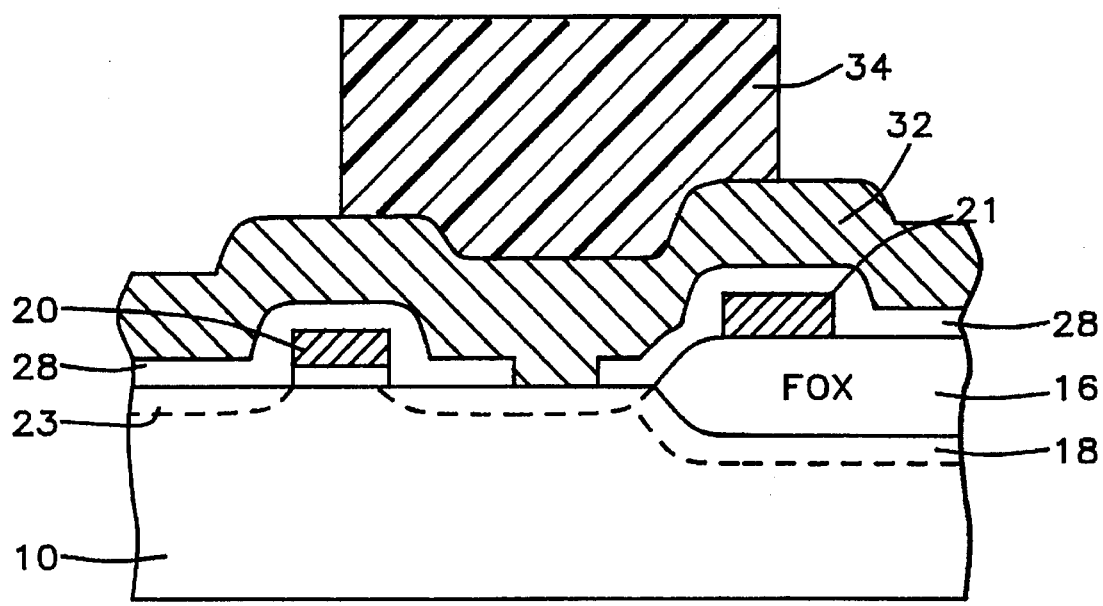

The formation of the stacked capacitor of the invention is shown in FIGS. 4 through 13. Referring now to FIG. 4, a layer 32 of doped polysilicon is deposited to a thickness of between about 4000 and 8000 Angstroms. This layer is doped in the same manner as the first poly layer from which the gate 20 and word line 21 were formed, described above. A layer of photoresist 34 is deposited and patterned, as shown in FIG. 4, by conventional lithography. This first photoresist mask is approximately centered over the opening 30.

In a critical series of steps in the invention, shown in FIGS. 5 to 9, a two-step pattern of removing a portion of the top of doped poly 32, followed by laterally etching the photoresist, will be repeated several times to form the stepped sides of the bottom ladder storage node for the stack capacitor. Three such repetitions are shown, but it will be understood by those familiar with the art that this number may be changed to two or four or more, depending on the photoresist thickness.

Figure 5:
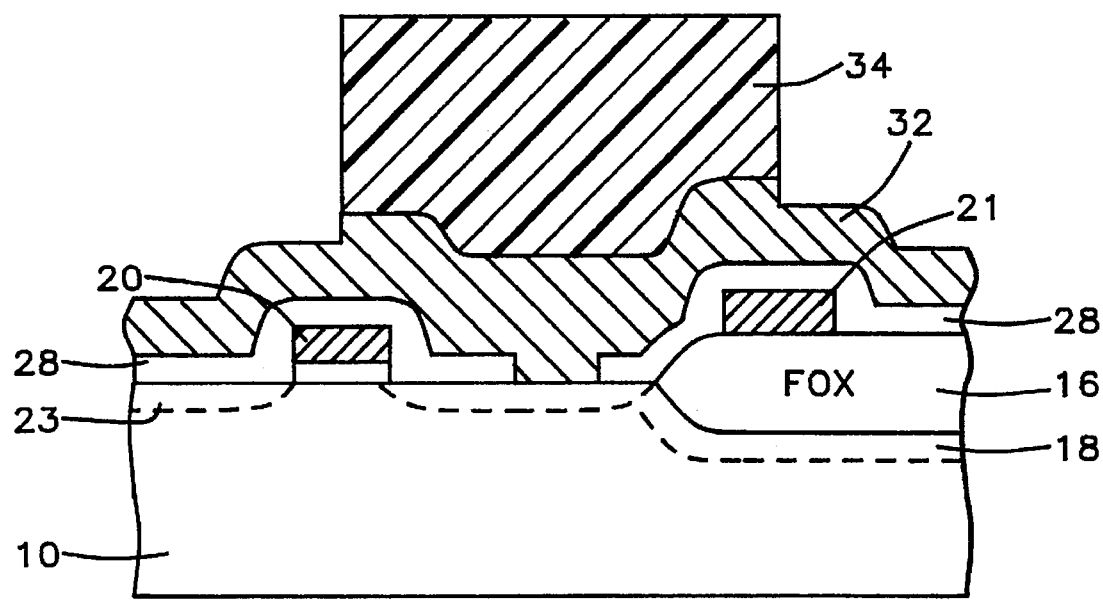

With reference to FIG. 5, the first anisotropic etch of doped poly 32 is shown. This partial etch is accomplished by reactive ion etching with $Cl_2$ (chlorine) at 420 sccm (standard cubic centimeters per minute), HBr (hydrogen bromide) at 80 sccm, and He (helium) at 180 sccm, at a pressure of about 300 mtorr, and a power of about 450 watts. A Rainbow 4400, manufactured by Lam Research Company, may be used for this etch. This removes a thickness of the top of doped poly 32 of about 2000 Angstroms, in the area not masked by first mask 34.

Figure 6:
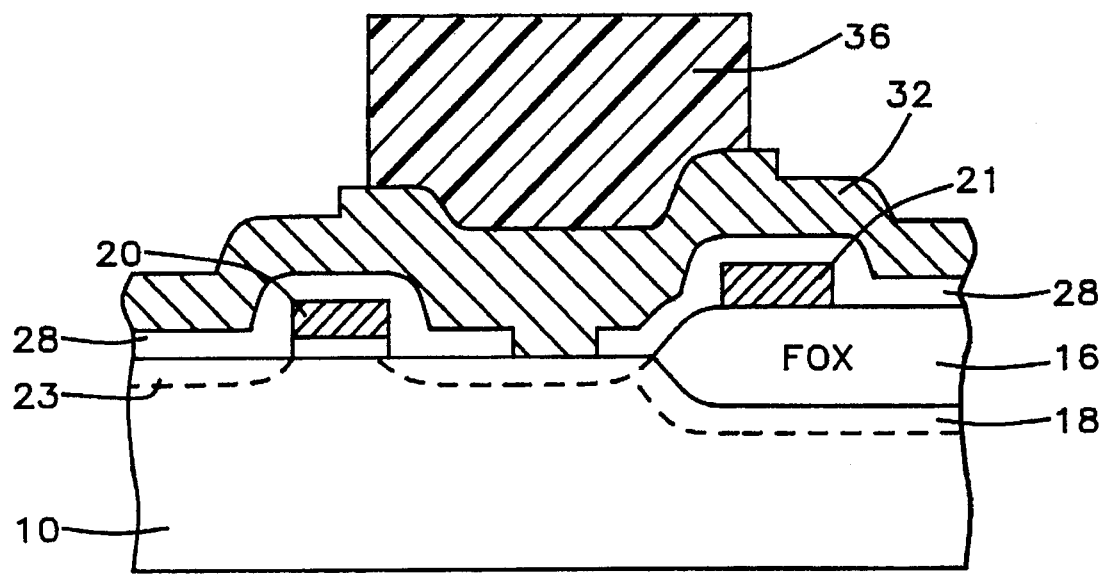

Referring now to FIG. 6, a lateral etch of first photoresist mask 34 is performed to form a second, narrower mask 36. This etch is performed by a plasma etch using oxygen $O_2$ at a gas flow rate of 50 sccm, pressure 50 mtorr and power 80 watts. The resultant etch rate is about 350 Angstroms per minute, and the equipment used is an AME 8110 manufactured by Applied Materials Research. This etch removes a thickness of between about 900 and 1100 Angstroms on the sides and about 1500 Angstroms from the top of first mask 34.

Figure 7:
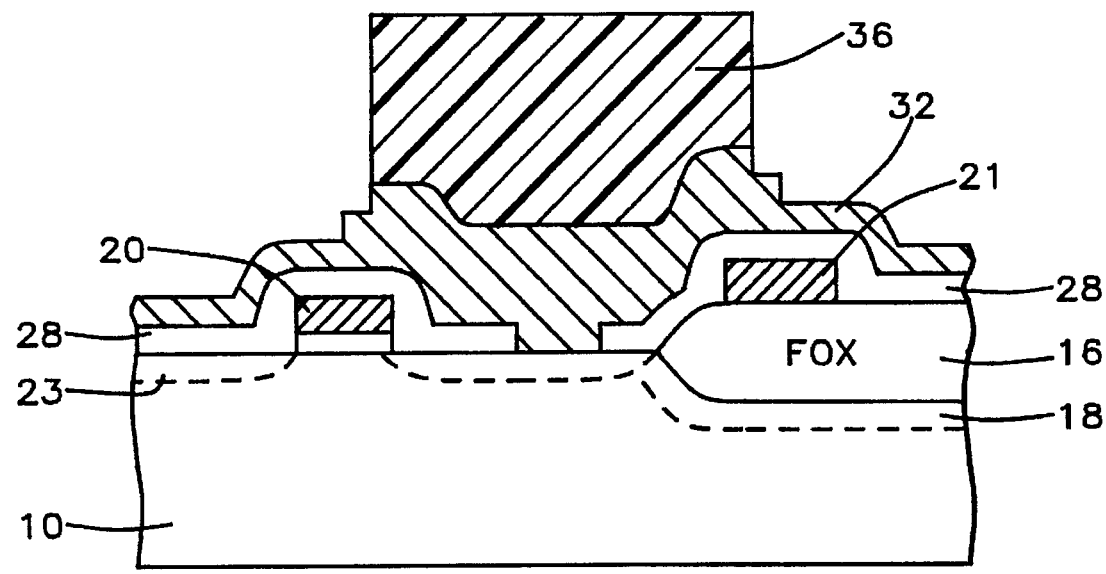
Figure 8:
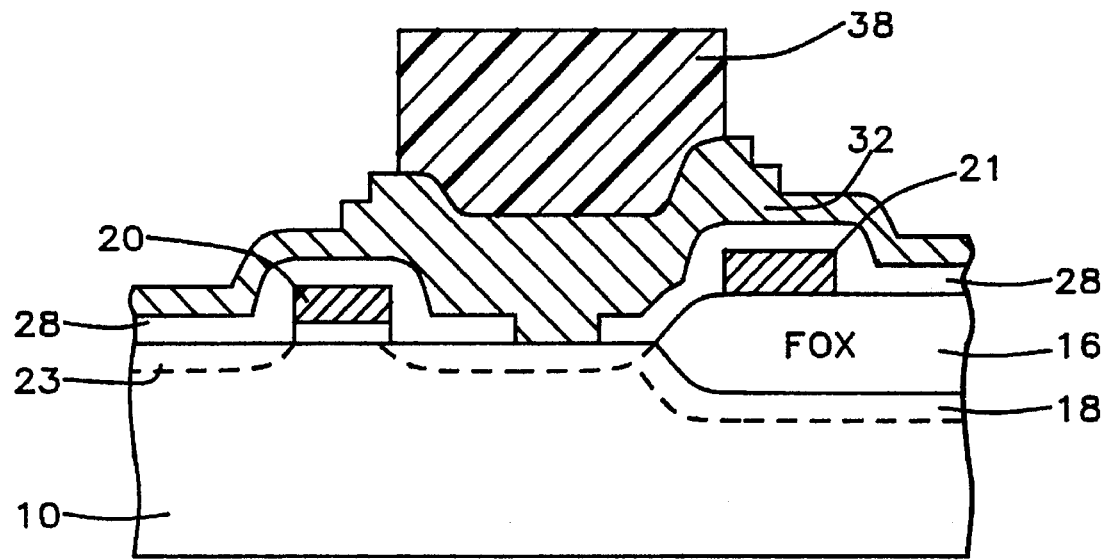
Figure 9:
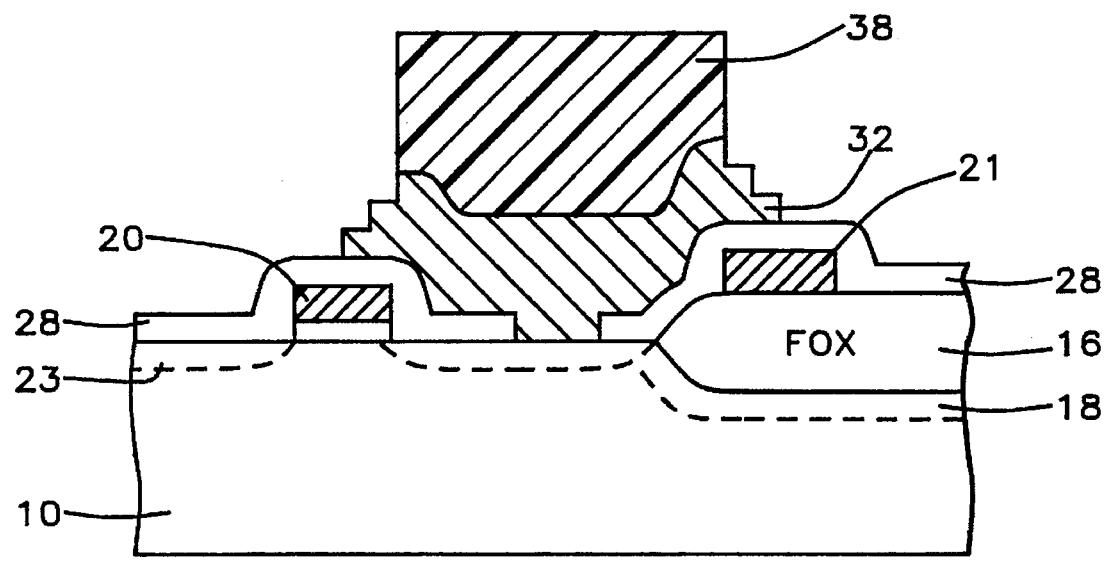
Figure 10:
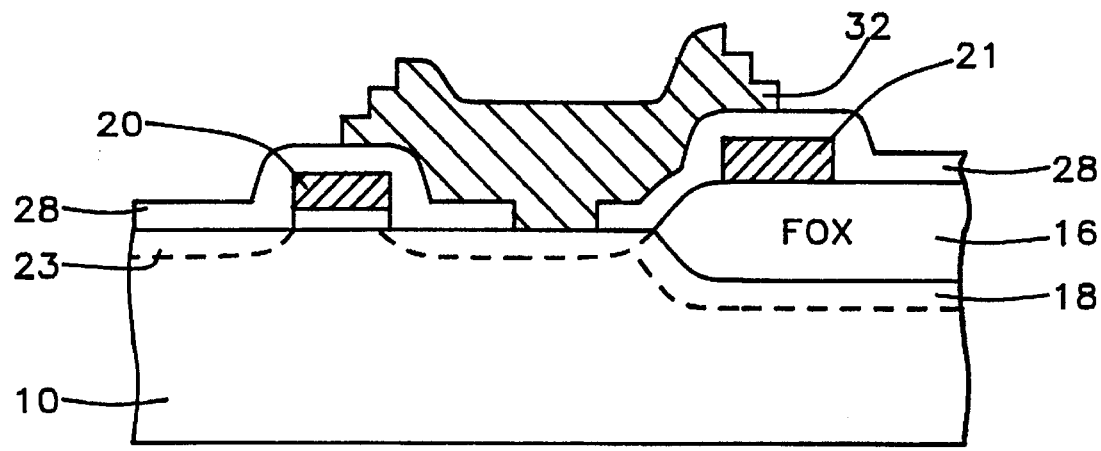

A second anisotropic etch is performed, as above, to remove another thickness of between about 1800 and 2200 Angstroms from poly 32. This is shown in FIG. 7, and results in the beginning of the "step" pattern of the ladder storage node. As shown in FIGS. 8 and 9, another oxygen plasma etch is performed, of second mask 36, to form third mask 38 by removing a thickness of between about 900 and 1100 Angstroms, followed by a final anisotropic etch of poly 32, which stops on oxide 28, and removes a final thickness of poly 32 of between about 1800 and 2200 Angstroms. As shown in FIG. 10, third mask 38 is removed to complete the bottom capacitor electrode 32, which forms the ladder storage node of the invention.

Figure 11:
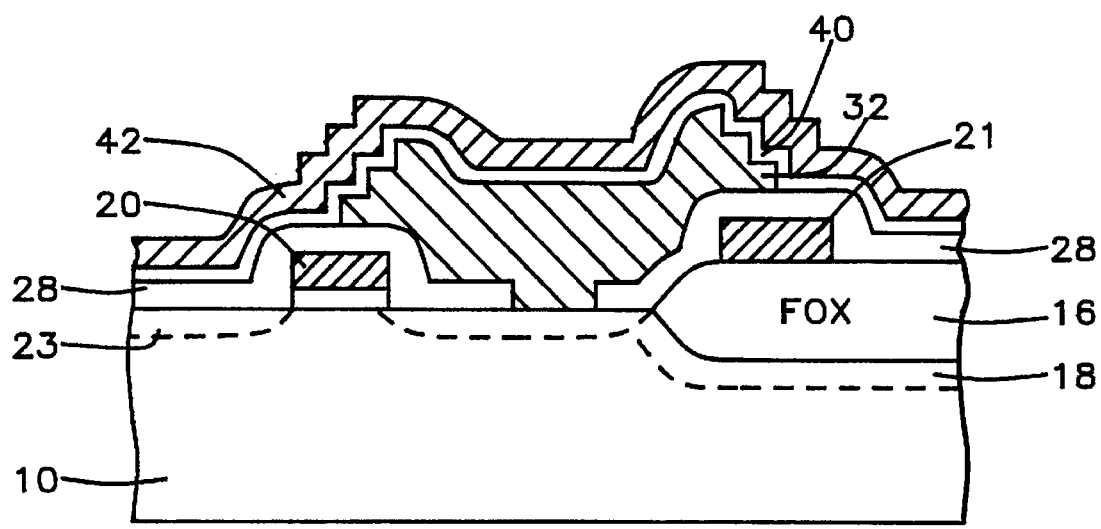

Referring now to FIG. 11, a capacitor dielectric 40 is formed over the surface of the ladder storage node 32. There are several materials that are suitable for the dielectric, such as ON (oxide-nitride), ONO (oxide-nitride-oxide), or $Ta_2O_5$ (tantalum oxide). The preferred dielectric is formed of ONO to a thickness of between about 30 and 90 Angstroms. The bottom oxide is formed by exposure in DI (deionized) water to a thickness of between about 20 and 40 Angstroms. The middle nitride is formed by LPCVD at a temperature of about 760° C., a pressure of 350 mtorr, in $NH_3$ (ammonia) and $SiH_4$ (silane), to a thickness of between about 20 and 50 Angstroms. The top oxide is formed by oxidation in a dry oxygen ambient, at a temperature of 850° C. for about 30 minutes.

The top electrode of the stack capacitor of the invention is now formed, by forming a layer of doped polysilicon, in the same manner as described earlier for the other layers of polysilicon, to a thickness of between about 500 and 2000 Angstroms.

The capacitor is completed by anisotropic etching of the dielectric and top electrode layers, to result in the final structure of FIG. 12, which includes ladder storage node 32, capacitor dielectric 40 and top electrode 42. It can be seen that the ladder storage node of the invention results in a smoother topography for subsequent layers than that provided by prior art capacitors like that shown in FIG. 13, which has bottom electrode 44, dielectric 46 and top electrode 48 and a substantially vertical capacitor sidewall 50. As opposed to the FIG. 13 structure, the method of the invention results in a stack capacitor with a gentle slope in all directions.

Figure 14:
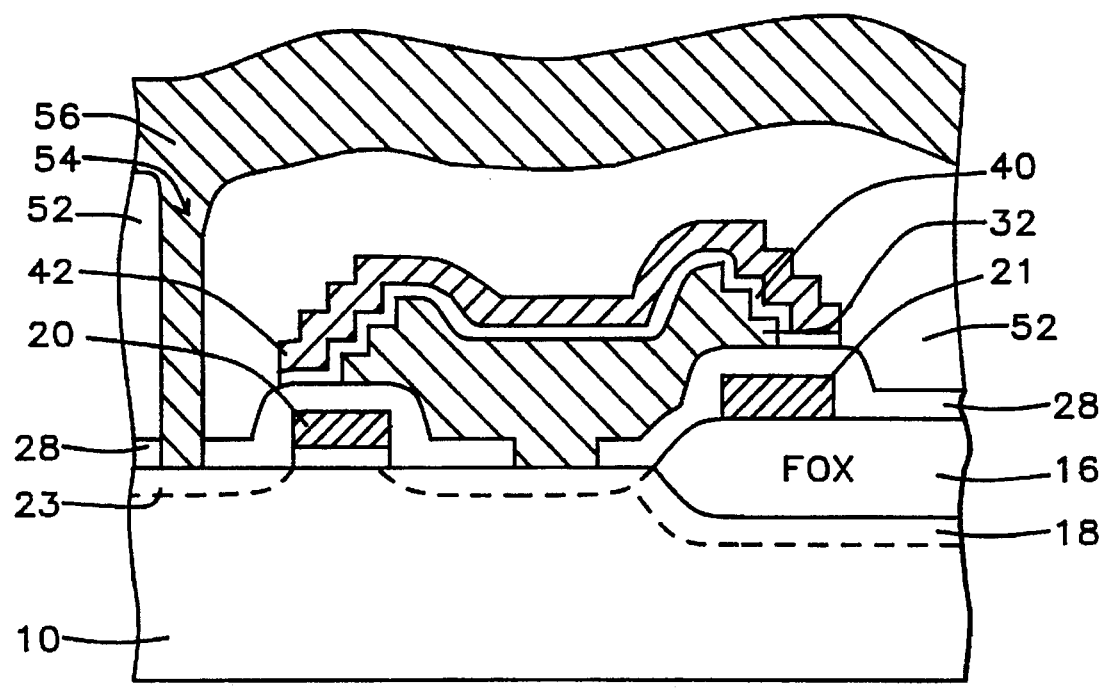
FIG. 14 is a cross-sectional representation of the resultant structure of the invention, of a DRAM cell with a stack capacitor having a ladder storage node, including a bit line contact.

As shown in FIG. 14, completion of the DRAM takes place, by depositing a thick insulating layer of borophosphosilicate glass (BPSG) 52 to a thickness of between about 3000 and 8000 Angstroms, and forming bit line node contact 54 from metallization layer 56, through the BPSG to drain region 23.

While the invention has been particularly shown and described with reference to the preferred embodiments thereof, it will be understood by those skilled in the art that various changes in form and details may be made without departing from the spirit and scope of the invention. For instance, while formation of an N-channel transistor was described prior to formation of the stacked capacitor of the invention, a P-channel transistor could have been similarly formed as part of the DRAM cell.

What is claimed is:

1. A DRAM (Dynamic Random Access Memory) stack capacitor having a ladder storage node, connected to a transistor with source and drain regions, comprising:

a bottom electrode, connected to and extending up from the source region of the transistor, with a top surface having a central cavity, and side surfaces extending down from said top surface in steps, wherein said steps form an inclined profile in their entirety, wherein said steps have alternating substantially horizontal and substantially vertical surfaces, wherein said substantially horizontal surfaces have a length of between about 900 and 1100 Angstroms and wherein said bottom electrode has a thickness of between about 4000 and 8000 Angstroms, and is formed of doped polysilicon;

a capacitor dielectric over said bottom electrode; and a top electrode over said capacitor dielectric.

2. The DRAM stack capacitor of claim 1 wherein said substantially vertical surfaces have a height of about 2000 Angstroms.

* * * * *